May 28, 1968 H. R. STURM 3,386,044

OUTPUT AMPLIFIER STAGE FOR CONVERTING SYMMETRICAL SIGNALS TO UNSYMMETRICAL SIGNALS WITH RESPECT TO A REFERENCE POTENTIAL

Filed June 9, 1965

INVENTOR.
HEINRICH RUDOLF STURM
BY Haane and Nydick
ATTORNEYS

United States Patent Office 3,386,044
Patented May 28, 1968

3,386,044

OUTPUT AMPLIFIER STAGE FOR CONVERTING SYMMETRICAL SIGNALS TO UNSYMMETRICAL SIGNALS WITH RESPECT TO A REFERENCE POTENTIAL

Heinrich Rudolf Sturm, Stockholm, Sweden, assignor to Telefonaktiebolaget L M Ericsson, Stockholm, Sweden, a corporation of Sweden Filed June 9, 1965, Ser. No. 462,522
Claims priority, application Sweden, July 27, 1964, 9,105/64
4 Claims. (Cl. 330—14)

ABSTRACT OF THE DISCLOSURE

An output amplifier stage converts symmetrical or balanced signals received at two input signal terminals to an unsymmetric or unbalanced signal with respect to ground. The stage comprises a phase inverting amplifier and an impedance transforming amplifier. The input of each of the amplifiers is connected to one of the two input signal terminals respectively. In addition, the output of the phase inverting amplifier is connected to the input of the impedance transforming amplifier. An output signal terminal of the stage is connected to the output of the impedance transforming amplifier to deliver an output signal which is unsymmetric with respect to a given potential present on a second output signal terminal of the stage.

The present invention refers to an output stage, which is intended to be connected to the output of a balanced direct voltage amplifier for conversion of the output voltage from symmetrical to unsymmetrical in relation to ground for obtaining a low ohmic output and for obtaining an amplification of the applied signal voltages.

In direct voltage amplifiers, i.e., DC amplifiers there are often great demands made for a good neutral point stability. In order to achieve this stability, so called balanced amplifiers are usually used, that is the voltage obtained from the amplifier is symmetrical in relation to ground. It is, however, disadvantageous to have the output voltage live in relation to ground, as it often is wanted to have one terminal in a following stage grounded. Several circuits have been developed in which a transformation is made from symmetrical into unsymmetrical output in relation to ground. The amplifiers hitherto used are, however, rather complicated, and require a large number of components. In addition they are difficult to regulate to suitable operating values. In adidtion such amplifiers will also be expensive to manufacture and, above everything else, disadvantageous from an operation point of view as a great deal of the obtained amplification will be lost in the output stage.

An object of the present invention is therefore to achieve an output stage which enables the transformation from a symmetrical output into an unsymmetrical output without losing any amplification but on the contrary obtains a further amplification in the output stage. The invention is mainly characterized by a phase shifting stage and an impedance transforming stage connected to the input terminals of the output stage. The output of the phase shifting stage is connected by a variable resistance to the input of the impedance transforming stage. The output terminals of the output stage are connected to the output of the impedance transforming stage and to ground respectively. The phase shifting and impedance transforming stages are so arranged that oppositely phased voltage changes across the input terminals of the output stage are amplified and similarly phased voltage changes are neutralized.

Figure 1:
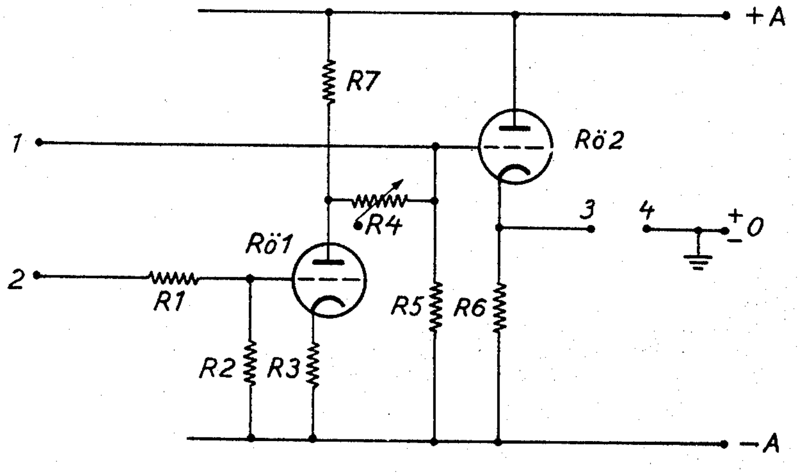
Figure 2:
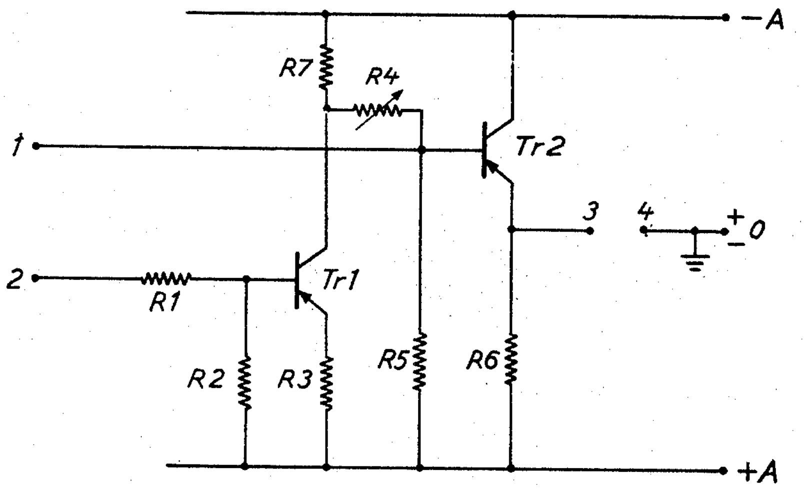

The invention will be further described in connection with the accompanying drawing, where FIG. 1 shows an output stage according to the invention provided with vacuum tubes and where FIG. 2 shows a corresponding output stage utilizing transistors.

FIG. 1 consequently shows an output stage comprising the tubes Rö1 and Rö2, where tube Rö2 is connected as a cathode follower amplifier and tube Rö1 in a usual feed back connection as a phase shifter. The tube Rö2 has its grid connected to the one input terminal 1 of the output stage and the tube Rö1 has its grid connected to the other input terminal 2 through a resistance R1. The anode of the tube Rö2 is connected to the positive pole +A of a voltage source (not shown), to which also the anode of the tube Rö1 is connected through a resistance R7. The anode of the tube Rö1 is further connected to the grid of the tube Rö2 by a variable resistance R4. The tube Rö2 has its cathode, through the resistance R6 connected to the negative pole —A of voltage source. To the same voltage source is also connected the cathode of the tube Rö1 through the resistance R3 and the grid through the resistance R2. One output terminal 3 of the output stage is connected to the cathode of the tube Rö2. The other output terminal 4 is connected to ground. This last terminal 4 has consequently zero potential.

A signal voltage at the input terminals 1, 2 of the output stage is consequently applied on the tubes Rö1 and Rö2. In the tube Rö1 the incoming voltage is amplified and is supplied to the grid of the tube Rö2 through the regulating resistance R4. Here it is added to the voltage already existing on the grid.

The anode resistance R7, the cathode resistance R3 and the potential divider R1, R2 connected to the grid of the tube Rö1 are so dimensioned that the voltage between the anode of the tube Rö1 and terminal —A is equal to the potential between the grid of the tube Rö2 and terminal —A. This is applicable when no signal is on the input terminals and at normal operating voltage. If now a change in the voltage arises in such a way that the voltage supplied to the grids of the two tubes will have the same polarity in relation to the voltage at terminal —A, then there will be a voltage on the anode of the tube Rö1 which is out of phase with the voltage on the grid of the tube Rö2. By the resistance R4 the voltage on the anode of the tube Rö1 is so regulated that it will have the same magnitude as the voltage on the grid of the tube Rö2, so that the voltages are compensated. At such changes of the voltage on the grids of the two tubes, that is where the grids have the same polarity in relation to the voltage at terminal —A, no influence will consequently be obtained from the output voltage. Voltage changes of this kind can arise owing to variations of the operating voltages and ageing of tubes and other components. Thereby it is sufficient to initially adjust the resistance R4 to such a value that these voltage changes will be compensated.

If now a signal voltage appears across the input terminals 1, 2 of the output stage the voltage will be between the grids of the tubes Rö1 and Rö2. This voltage is composed of the voltage between the terminal —A of the voltage source and the grid of the tube Rö2 and the voltage between the terminal —A and the grid of the tube Rö1. The voltages of the grids of the tubes Rö1 and Rö2 thereby receive different polarities in relation to the polarity of the terminal —A of the voltage source. On the grid of the tube Rö2 a voltage will arise which is composed of the voltage coming in directly to the tube Rö2 and the voltage coming from the anode of the tube Rö1. As a result of the voltage fed to the grid of the tube Rö1 being phase shifted, the voltages on the grid of the tube Rö2 obtain the same polarity and the voltages will thus interact i.e. the tube Rö1 amplifies the incoming signal. The amplified signal is consequently supplied to the grid of the tube Rö2 and is then taken out between the cathode of this tube and ground. The operating point of the tube is so chosen that the voltage between its grid and terminal −A is equal to the voltage between the anode of the tube Rö1 and terminal −A.

By aid of the connection described voltage changes of the same polarity in relation to the common pole of the voltage source appearing on the input terminals will be compensated, while signal voltages coming in to the input terminals will be amplified. Further the connection has an output which has a low impedance and which is unsymmetrical in relation to ground.

FIG. 2 shows the same connection provided with transistors. Here two transistors Tr1 and Tr2 are used with the resistors having the same reference numbers as the previously described resistors. The base of the transistor Tr2 is connected to the input terminal 1 and the base of the transistor Tr1 is, through the resistance R1, connected to the input terminal 2. The transistor Tr2 has its emitter and base connected with the positive pole +A of a voltage source through the resistance R6 and R5 respectively. The transistor Tr1 has its emitter and base connected to the same terminal of the voltage source through the resistances R3 and R2 respectively. The transistor Tr2 has further its collector connected to the negative pole −A of the voltage source and the same terminal of the voltage source is connected to the collector of the transistors Tr1 through the resistance R7. Between the collector of the transistor Tr1 and the base of the transistor Tr2 is furthermore connected a variable resistance R4. The circuit of this embodiment is consequently composed of a phase shifter stage in the form of a transistor connected as a common emitter and impedance transforming stage in the form of a transistor connected as an emitter follower. The circuit described above comprises pnp-transistors, but can of course also be carried out with npn-transistors, whereby the positive and negative terminal of the voltage source are interchanged.

I claim:

1. An output amplifier stage for converting signals symmetrical with respect to a reference potential to a signal unsymmetrical with respect to said reference potential, said amplifier stage comprising in combination:
- first and second signal input terminals adapted to receive said symmetrical signals;
- first and second signal output terminals, said first signal output terminal being adapted to receive said reference potential and said second output terminal being adapted to transmit said unsymmetrical signal;
- an impedance transforming amplifier means including an input terminal and an output terminal and further including a first vacuum tube having an anode, a cathode and a grid;
- a phase shifting amplifier means including an input terminal and an output terminal and further including a second vacuum tube having an anode, a cathode and a grid;
- means for connecting the input terminal of said impedance transforming amplifier means to said first signal input terminal;
- means for connecting the input terminal of said phase shifting amplifier means to said second signal input terminal;
- variable resistance means for transmitting signals from the output terminal of said phase shifting amplifier means to the input terminal of said impedance transforming amplifier means;
- means for connecting the output terminal of said impedance transforming amplifier means to said second signal output terminal;
- a source of operating potential including a first output terminal having a potential with one polarity with respect to said reference potential and a second output terminal having a potential with a polarity opposite to said one polarity;
- means for connecting the anode of said first vacuum tube to the first output terminal of said source of operating potential;
- first resistance means for connecting the cathode of said first vacuum tube to the second output terminal of said source of operating potential;
- means for connecting said first signal input terminal to the grid of said first vacuum tube;
- means for connecting the cathode of said first vcauum tube to said second signal output terminal;
- second resistance means for connecting the anode of said second vacuum tube to the first output terminal of said source of operating potential;
- means for connecting the cathode of said second vacuum tube to the second output terminal of said source of operating potential;
- means for connecting the grid of said second vacuum tube to said second signal input terminal; and
- means for connecting said variable resistance means between the grid of said first vacuum tube and the anode of said second vacuum tube,
- whereby signals received at said first and second signal input terminals having the same phase are neutralized while signals received at said first and second signal input terminals having opposite phases are amplified and transmitted from said second signal output terminal.

2. The output amplifier stage of claim 1 wherein said means for connecting the cathode of said second vacuum tube to the second output terminal of said source of operating potential is a third resistance means and the means for connecting the grid of said second vacuum tube to said second signal input terminal is a fourth resistance means and further comprising fifth resistance means for connecting the grid of said second vacuum tube to the second output terminal of said source of operating potential, the magnitude of the resistances of said second, third, fourth and fifth resistance means being chosen so that, in the absence of signals at said input signal terminals, the voltage difference between the grid of each first vacuum tube and the second output terminal of said source of operating potential equals the voltage difference between the anode of said second vacuum tube and the second output terminal of said source of operating potential.

3. An output amplifier stage for converting signals symmetrical with respect to a reference potential to a signal unsymmetrical with respect to said reference potential, said amplifier stage comprising in combination:
- first and second signal input terminals adapted to receive said symmetrical signals;
- first and second signal output terminals, said first signal output terminal being adapted to receive said reference potential and said second output terminal being adapted to transmit said unsymmetrical signal;
- an impedance transforming amplifier means including an input terminal and an output terminal and further including a first transistor having an emitter, a collector and a base;
- a phase shifting amplifier means including an input terminal and an output terminal and further including a second transistor having an emitter, a collector and a base;
- means for connecting the input terminal of said impedance transforming amplifier to said first signal input terminal;
- means for connecting the input terminal of said phase shifting amplifier to said second signal input terminal;
- variable resistance means for transmitting signals from the output terminal of said phase shifting amplifier means to the input terminal of said impedance transforming amplifier means;

means for connecting the output terminal of said impedance transforming amplifier means to said second signal output terminal;

a source of operating potential including a first output terminal having a potential with one polarity with respect to said reference potential and a second output terminal having a potential with a polarity opposite to said one polarity;

means for connecting the collector of said first transistor to the first output terminal of said source of operating potential;

first resistance means for connecting the emitter of said first transistor to the second output terminal of said source of operating potential;

means for connecting said first signal input terminal to the base of said first transistor;

means for connecting the emitter of said first transistor to said second signal output terminal;

second resistance means for connecting the collector of said second transistor to the first output terminal of said source of operating potential;

means for connecting the emitter of said second transistor to the second output terminal of said source of operating potential;

means for connecting the base of said second transistor to said second signal input terminal; and means for connecting said variable resistance means between the base of said first transistor and the collector of said second transistor;

whereby signals received at said first and second signal input terminals having the same phase are neutralized while signals received at said first and second signal input terminals having opposite phases are amplified and transmitted from said second signal output terminal.

4. The output amplifier stage of claim 3 wherein said means for connecting the emitter of said second transistor to the second output terminal of said source of operating potential is a third resistance means and the means for connecting the base of said second transistor to said second signal input terminal is a fourth resistance means and further comprising fifth resistance means for connecting the base of said second transistor to the second output terminal of said source of operating potential, the magnitude of the resistances of said second, third, fourth and fifth resistance means being chosen so that, in the absence of signals at said input signal terminals, the voltage difference between the base of said first transistor and the second output terminal of said source of operating potential equals the voltage difference between the collector of said second transistor and the second output terminal of said source of operating potential.

References Cited

UNITED STATES PATENTS

| | | | |
|---|---|---|---|
| 2,547,538 | 4/1951 | Rieke | 330—116 X |
| 3,260,955 | 7/1966 | Offner | 330—116 X |

ROY LAKE, *Primary Examiner.*

J. B. MULLINS, *Assistant Examiner.*